US012775030B2

(12) United States Patent
Kadlecek et al.

(10) Patent No.: US 12,775,030 B2
(45) Date of Patent: Oct. 27, 2026

(54) POWER TOOL

(71) Applicant: Black & Decker Inc., New Britain, CT (US)

(72) Inventors: Daniel Kadlecek, Bischofsheim (DE); Tim Heimrich, Bad Camberg (DE); Rene Thieme, Riesa (DE)

(73) Assignee: BLACK AND DECKER INC., New Britain, CT (US)

( * ) Notice: Subject to any disclaimer, the term of this patent is extended or adjusted under 35 U.S.C. 154(b) by 197 days.

(21) Appl. No.: 18/420,192

(22) Filed: Jan. 23, 2024

(65) Prior Publication Data

US 2024/0280612 A1 Aug. 22, 2024

(30) Foreign Application Priority Data

Feb. 20, 2023 (EP) .................................... 23157622

(51) Int. Cl.
*G01R 19/165* (2006.01)
*G08B 3/10* (2006.01)
(Continued)

(52) U.S. Cl.
CPC . *G01R 19/16523* (2013.01); *G01R 19/16533* (2013.01); *G08B 3/10* (2013.01);
(Continued)

(58) Field of Classification Search
CPC ....... G01R 19/16523; G01R 19/16533; H01M 50/247; H01M 2220/30; G08B 3/10; G08B 5/36; H02P 6/06
(Continued)

(56) References Cited

U.S. PATENT DOCUMENTS 3,412,392 A 11/1968 Jenkins et al.
5,121,108 A 6/1992 Schemmel
(Continued)

FOREIGN PATENT DOCUMENTS

AU 2021103879 A4 10/2021
CN 105914809 A 8/2016
(Continued)

OTHER PUBLICATIONS

Extended European Search Report dated Aug. 21, 2023 in corresponding EP application No. 23157622.4, 6 pages.
(Continued)

*Primary Examiner* — Stephanie E Bloss
*Assistant Examiner* — Michael A Harrison
(74) *Attorney, Agent, or Firm* — Womble Bond Dickinson (US) LLP

(57) ABSTRACT

A power tool includes a housing and an electrical power source. A control circuit is electrically connected to the electrical power source and configured to control at least one operation of the power tool. A power tool condition indication circuit is electrically connected to the control circuit comprising a zener diode configured to be conductive at a threshold voltage. The power tool condition indication circuit is configured generate a first indication signal when a voltage controlled by the control circuit exceeds the threshold voltage and generate a second indication signal when a voltage controlled by the control circuit is below the threshold voltage.

20 Claims, 5 Drawing Sheets

(51) Int. Cl.
*G08B 5/36* (2006.01)
*H01M 50/247* (2021.01)
*H02P 6/06* (2006.01)

(52) U.S. Cl.
CPC ............ *G08B 5/36* (2013.01); *H01M 50/247* (2021.01); *H02P 6/06* (2013.01); *H01M 2220/30* (2013.01)

(58) Field of Classification Search
USPC ........................................................ 324/76.11
See application file for complete search history.

(56) References Cited

U.S. PATENT DOCUMENTS

| | | | | |
|---|---|---|---|---|
| 6,426,704 | B1 * | 7/2002 | Hutchison | F21S 8/00 340/815.45 |
| 10,393,792 | B1 | 8/2019 | Yang et al. | |
| 2003/0194283 | A1 * | 10/2003 | Kovarik | H03K 17/96 408/4 |
| 2013/0049610 | A1 | 2/2013 | Chen | |
| 2014/0055032 | A1 | 2/2014 | Keller et al. | |
| 2014/0191676 | A1 | 7/2014 | Seider et al. | |
| 2016/0242246 | A1 | 8/2016 | Zhang et al. | |
| 2017/0222382 | A1 * | 8/2017 | Peloquin | H01R 27/02 |
| 2020/0352822 | A1 * | 11/2020 | Marton | A61H 23/006 |
| 2021/0151978 | A1 | 5/2021 | Uchman | |

FOREIGN PATENT DOCUMENTS

| | | | |
|---|---|---|---|
| CN | 108668400 | A | 10/2018 |
| JP | 2007109483 | A | 4/2007 |
| RU | 2507660 | C2 | 2/2014 |
| WO | 2000065718 | A1 | 11/2000 |

OTHER PUBLICATIONS

Extended European Search Report dated Dec. 12, 2025, in corresponding EP Application No. 25209597.1, 5 pages.

* cited by examiner

POWER TOOL

CROSS REFERENCE TO RELATED APPLICATIONS

This application claims the benefit of EP Application No. 23157622.4 filed on Feb. 20, 2023. The entire disclosure of the above application is incorporated herein by reference.

BACKGROUND

Field

The present disclosure relates to a power tool. In particular the present disclosure relates to a power tool comprising a power tool condition indication circuit.

Description of Related Art

It is known to have motor control circuits in power tools. The motor control circuit is configured to control the speed of the motor and the cutting tool. Typically the motor control circuit comprises a motor control unit such as an integrated circuit with a plurality of input and outputs.

It is known to configure the motor control unit to drive one or more LEDs to indicate a power tool condition to the user. It may be preferable on a power tool to indicate one or more conditions to the user with a LED because the LED is robust and can withstand the rough treatment a power tool experiences in a worksite.

However a problem with existing motor control units is that there is a limited number of outputs pins, for example four outputs. Therefore, the motor control unit is limited in the amount of information that can be provided to the user when using the outputs to drive LEDs.

One option can be to use the plurality of outputs on the motor control unit to drive an additional integrated circuit control unit or digital electronics for switching one or more LEDs. However, additional control unit increases the complexity and cost of manufacture of the power tool.

SUMMARY

Examples of the present disclosure aim to address the aforementioned problems.

According to an aspect of the present disclosure there is a power tool comprising: a housing: an electrical power source; a control circuit electrically connected to the electrical power source and configured to control at least one operation of the power tool; and a power tool condition indication circuit electrically connected to the control circuit comprising a zener diode configured to be conductive at a threshold voltage: wherein the power tool condition indication circuit is configured generate a first indication signal when a voltage controlled by the control circuit exceeds the threshold voltage and generate a second indication signal when a voltage controlled by the control circuit is below the threshold voltage.

Optionally, the first indication signal is configured to actuate a first light emitting diode.

Optionally, the second indication signal is configured to actuate a second light emitting diode.

Optionally, the power tool condition indication circuit is configured to permit current to flow through a first transistor when the voltage controlled by the control circuit is below the threshold voltage.

Optionally, the power tool condition indication circuit is configured to permit current to flow through a second transistor when the voltage controlled by the control circuit exceeds the threshold voltage.

Optionally, the second indication signal is configured to indicate a second condition of the power tool.

Optionally, the second condition of the power tool is an overpressing condition of the tool.

Optionally, the first indication signal is configured to indicate a first condition of the power tool.

Optionally, the first condition is a rotation condition of the tool.

Optionally, the second condition and the first condition of the power tool correspond to different parameters of the power tool.

Optionally, the first indication signal is configured to actuate a first buzzer or speaker.

Optionally, the second indication signal is configured to actuate a second buzzer or speaker.

Optionally, the first and second indication signals are transmitted to a remote device.

Optionally, an output of the control circuit is electrically connected to a first MOSFET coupled to the electrical power source and the power tool condition indication circuit and the first MOSFET is configured to generate a pulse width modulation from the electrical power source in dependence of the output of the control circuit.

Optionally, the electrical power source is a battery mounted to the housing.

Optionally, the power tool comprises a motor mounted to the housing and electrically connected to the electrical power source and the control circuit is a motor control circuit configured to control the motor.

Optionally, the control circuit is configured to generate a pulse width modulation signal that controls the voltage applied to the power tool condition indication circuit.

Optionally, the power tool is a drill.

According to another aspect, there is provided a power tool accessory comprising: a housing: a control circuit electrically connectable to an electrical power source and configured to control at least one operation of the power tool accessory or a power tool; and a power tool condition indication circuit electrically connected to the control circuit comprising a zener diode configured to be conductive at a threshold voltage: wherein the power tool condition indication circuit is configured generate a first indication signal when a voltage controlled by the control circuit exceeds the threshold voltage and generate a second indication signal when a voltage controlled by the control circuit is below the threshold voltage.

Optionally, the power tool accessory is a battery pack and comprises the electrical power source.

According to another aspect, there is provided a power tool comprising: a housing: an electrical power source: a motor mounted to the housing and electrically connected to the electrical power source: a motor control circuit configured to control the motor; and a power tool condition indication circuit electrically connected to the motor control circuit comprising a zener diode configured to be conductive at a threshold voltage: wherein the power tool condition indication circuit is configured generate a first indication signal when a voltage controlled by the control circuit exceeds the threshold voltage and generate a second indication signal when a voltage controlled by the control circuit is below the threshold voltage.

BRIEF DESCRIPTION OF THE DRAWINGS

Various other aspects and further examples are also described in the following detailed description and in the attached claims with reference to the accompanying drawings, in which:

DETAILED DESCRIPTION OF EXAMPLE EMBODIMENTS

The drawings are for the purpose of illustration and description only and are not intended as a definition of the limits of the invention. In addition, it should be appreciated that structural features shown or described in any one embodiment herein can be used in other embodiments as well. As used in the specification and in the claims, the singular form of "a", "an", and "the" include plural referents unless the context clearly dictates otherwise.

Figure 1:
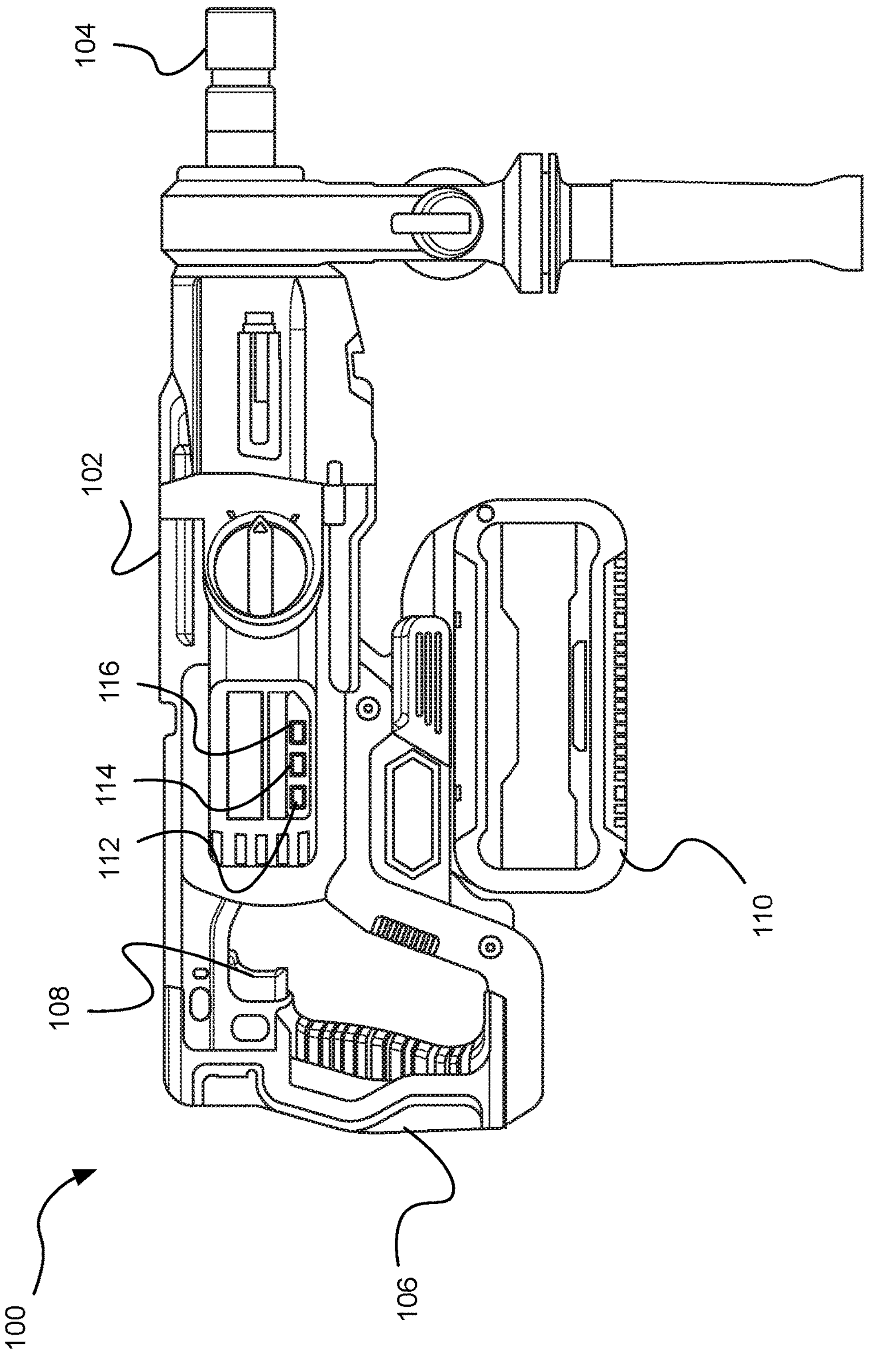
FIG. 1 shows a side view of a power tool according to an example.

FIG. 1 shows a side view of a power tool 100. The power tool 100 as shown in FIG. 1 is a drill. Whilst the power tool 100 as shown in FIG. 1 is a drill e.g. a diamond drill, the power tool 100 can be any other type of power tool can be used such as a diamond drill, a plunge saw, a circular saw, a hammer drill, a multitool, any other type of drill, an oscillating or any other power tool.

The power tool 100 comprises a housing 102. The housing 102 comprises a clam shell type construction having two halves which are fastened together. The halves of the housing 102 are fastened together with screws but in alternative examples any suitable means for fastening the housing 102 together may be used such as glue, clips, bolts and so on. For the purposes of clarity, the fastenings in the housing 102 are not shown in FIG. 1.

Figure 2:
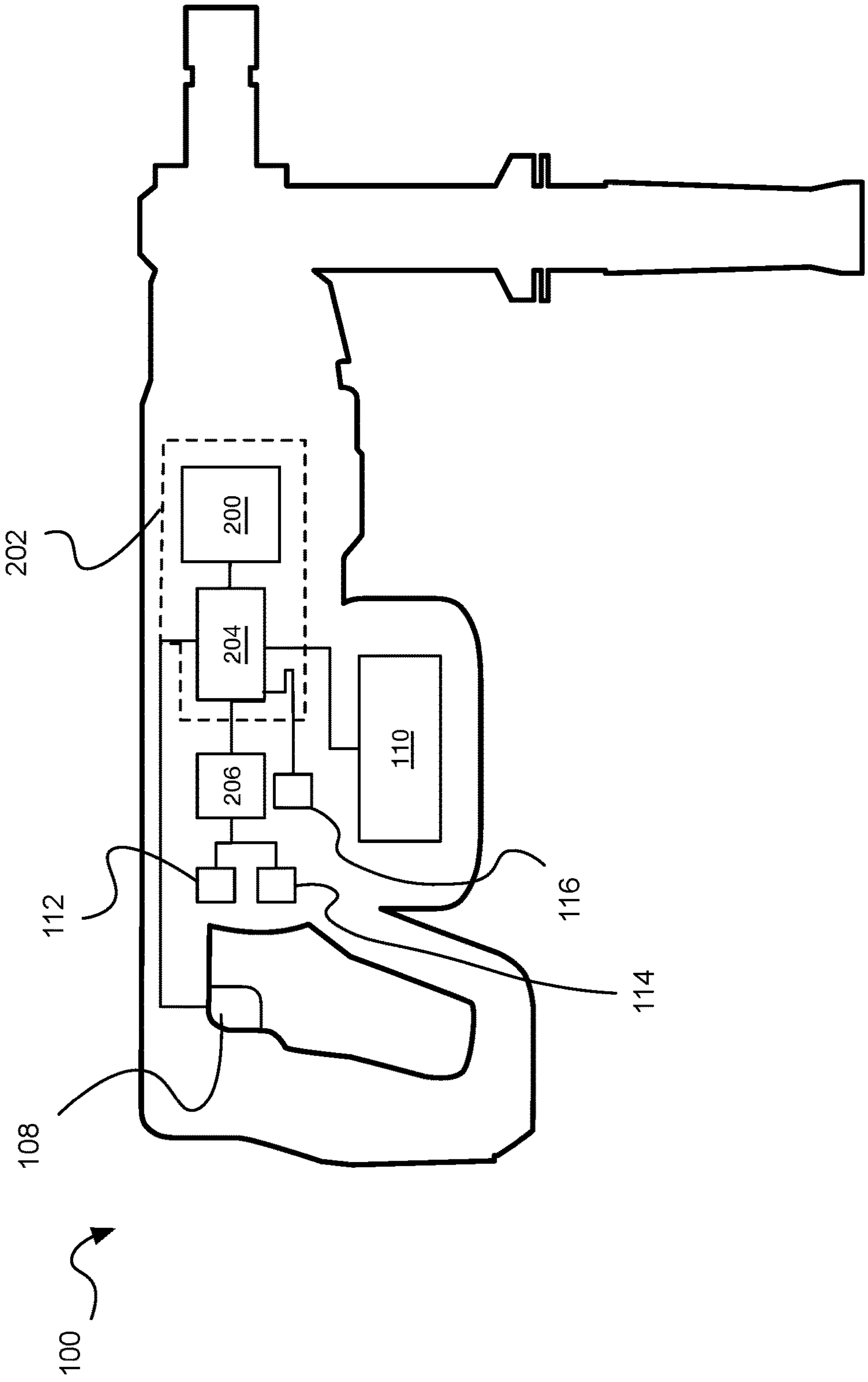
FIG. 2 shows a schematic side view of a power tool according to an example.

An electric motor 200 is mounted in a motor housing portion of the housing 102. The electric motor 200 is schematically represented in FIG. 2. FIG. 2 shows a schematic side view of the power tool 100.

The electric motor 200 drives a motor drive shaft (not shown) and the electric motor 200 is arranged to drive an output shaft (not shown). The output shaft is connected to a tool holder 104 for receiving and holding a tool (not shown) such as a cutting tool (not shown) or a screwdriver bit (not shown).

As shown in FIG. 1, the housing 102 comprises a handle 106 for the user to grip during use. A trigger button 108 is mounted on the handle 106 which is used by the user to activate the electric motor 200. In some examples, secondary user controls such as secondary trigger buttons (not shown) can also be mounted to the housing 102.

The electric motor 200 is electrically connected to a battery 110. The battery 110 is removably mountable to the housing 102 at the base of the handle 106. In some examples, the battery 110 is integral to the housing 102 and not removeable. Alternatively in other examples the power tool 100 is powered additionally or alternatively with mains power (not shown).

The housing 102 comprises one or more LED indicators 112, 114, 116 configured to indicate a condition of the power tool 100. The LED indicators 112, 114, 116 are mounted to the housing 102 and project through the housing 102. Alternatively, the LED indicators 112, 114, 116 are mounted behind a transparent window (not shown) mounted to the housing 102. Whilst FIG. 1 shows three LED indicators 112, 114, 116 there can be any number of LED indicators 112, 114, 116 to indicate one or more conditions of the power tool 100. FIG. 1 shows the LED indicators 112, 114, 116 mounted on a side of the housing 102 and are grouped together. In some other examples, the LED indicators 112, 114, 116 can be mounted at any position on the housing 102. Furthermore, the LED indicators 112, 114, 116 can be separated and positioned at different locations on the housing 102. The LED indicators 112, 114, 116 can comprise different colours or the same colour.

In some other examples, the LED indicators 112, 114, 116 can be additionally or alternatively another indicator such as a buzzer or speaker. This means that the user can receive an audio signal configured to indicate of a condition of the power tool 100. In other examples, the LED indicators 112, 114, 116 can be additionally or alternatively replaced with a haptic generator configured to provide a vibration in the handle 106 to indicate a condition of the power tool 100.

In some examples, the LED indicators 112, 114, 116 are configured to indicate one or more conditions of the power tool 100, including but not limited to: an overpressing condition of the power tool 100, the power tool 100 rotating condition with respect to the workpiece, a battery pack 110 condition, a low battery condition, an electric motor 200 stall condition, an overheating condition, a fault condition of the power tool or any other condition of the power tool 100 that is to be indicated to the user.

In some examples, the LED indicators 112, 114, 116 can indicate different fault conditions of the power tool 100. In some examples, the different fault conditions are not related to each other and therefore different LED indicators 112, 114 are needed. For example, in some examples a first LED indicator 112 is configured to provide an indication of an overpressing condition of the power tool 100 and a second LED indicator 114 is configured to provide an indication of a power tool rotation condition. In some examples, alternatively or additionally the first LED indicator 112 is configured to provide an indication of an operating condition e.g. a power setting. The second LED indicator 114 is configured to provide an indication of another operating condition e.g. a speed setting or a tilt condition. Any other condition of the power tool 100 can be indicated with the first LED indicator 112 and/or the second LED indicator 114.

Figure 3:
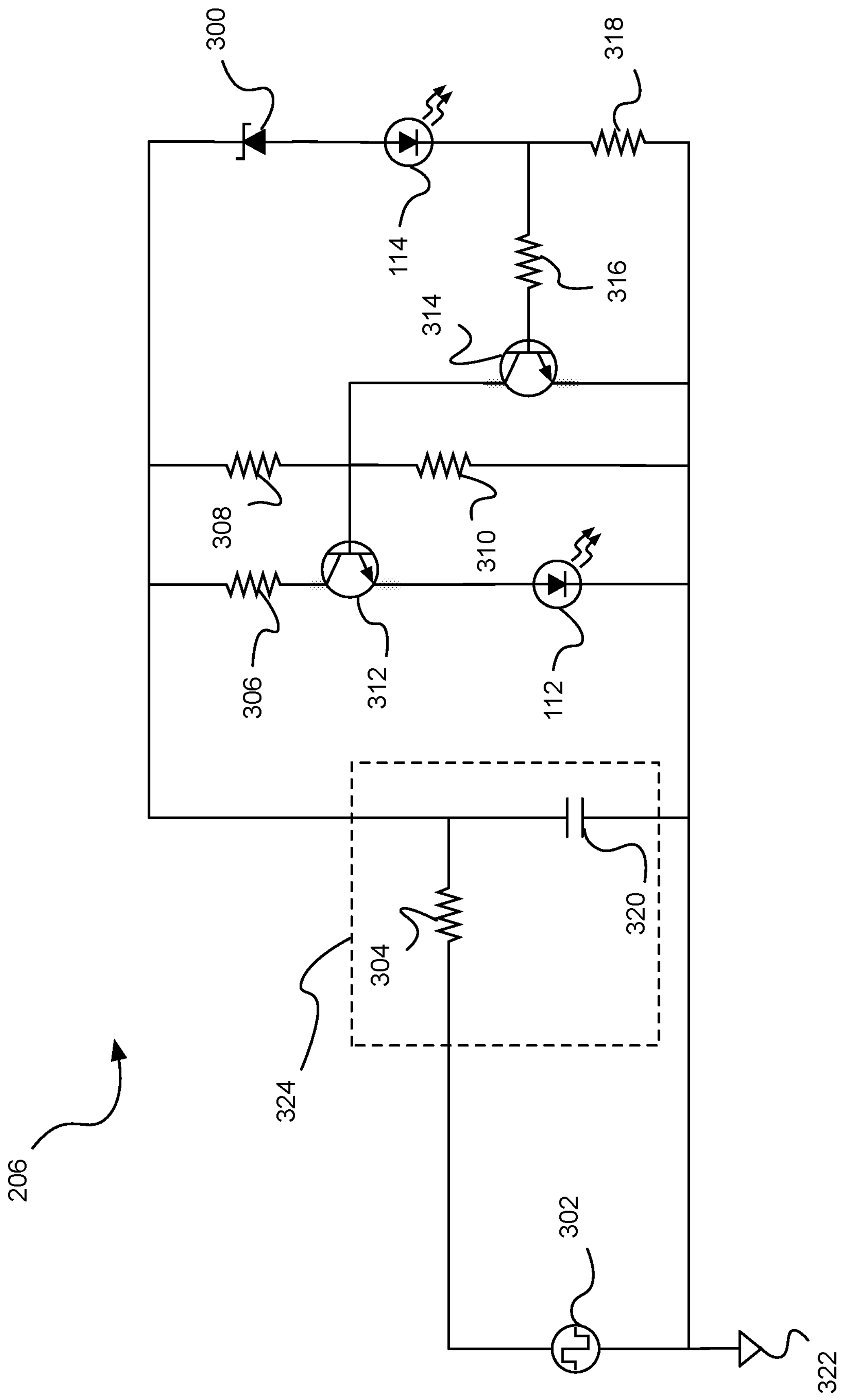
FIG. 3 shows electrical circuit diagrams of a power tool according to an example.
Figure 4:
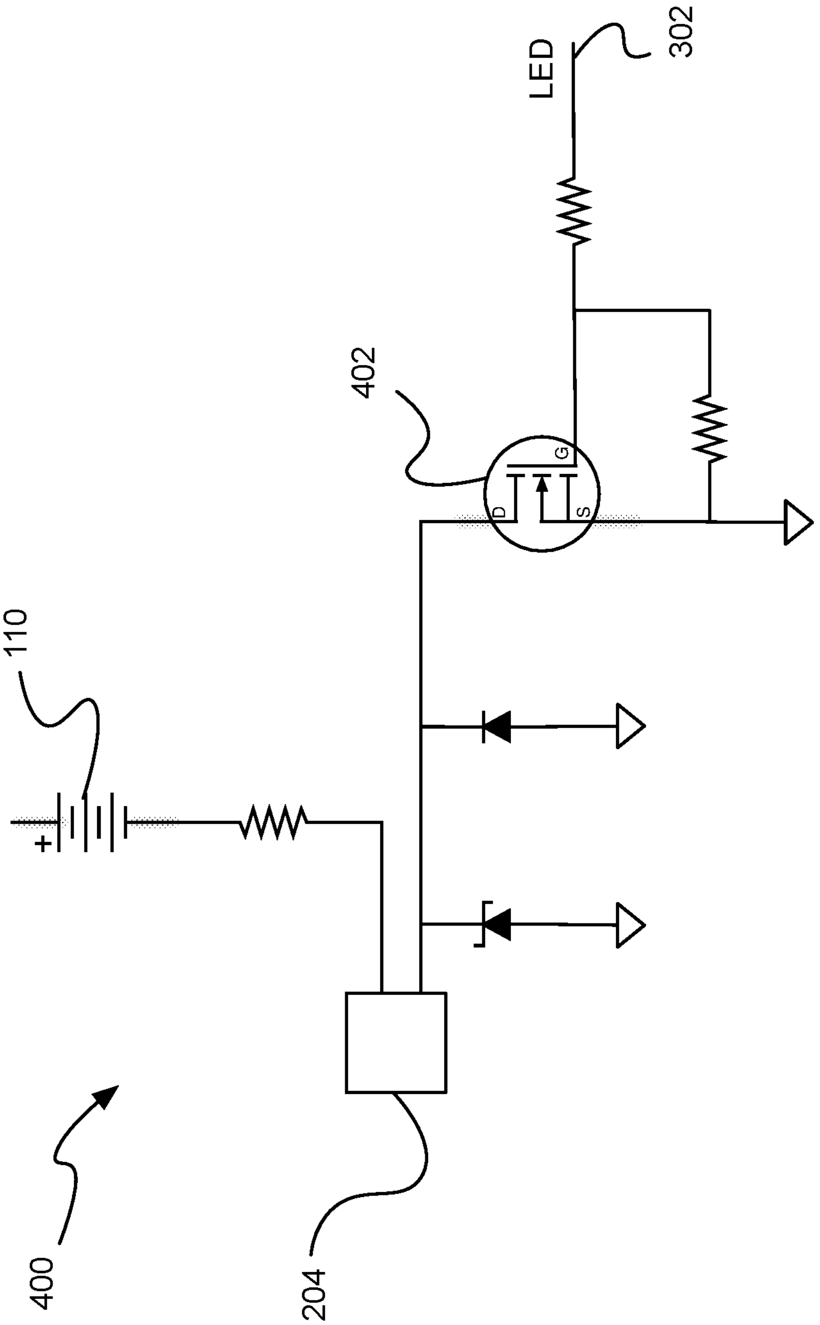
FIG. 4 shows electrical circuit diagrams of a power tool according to an example.
Figure 5:
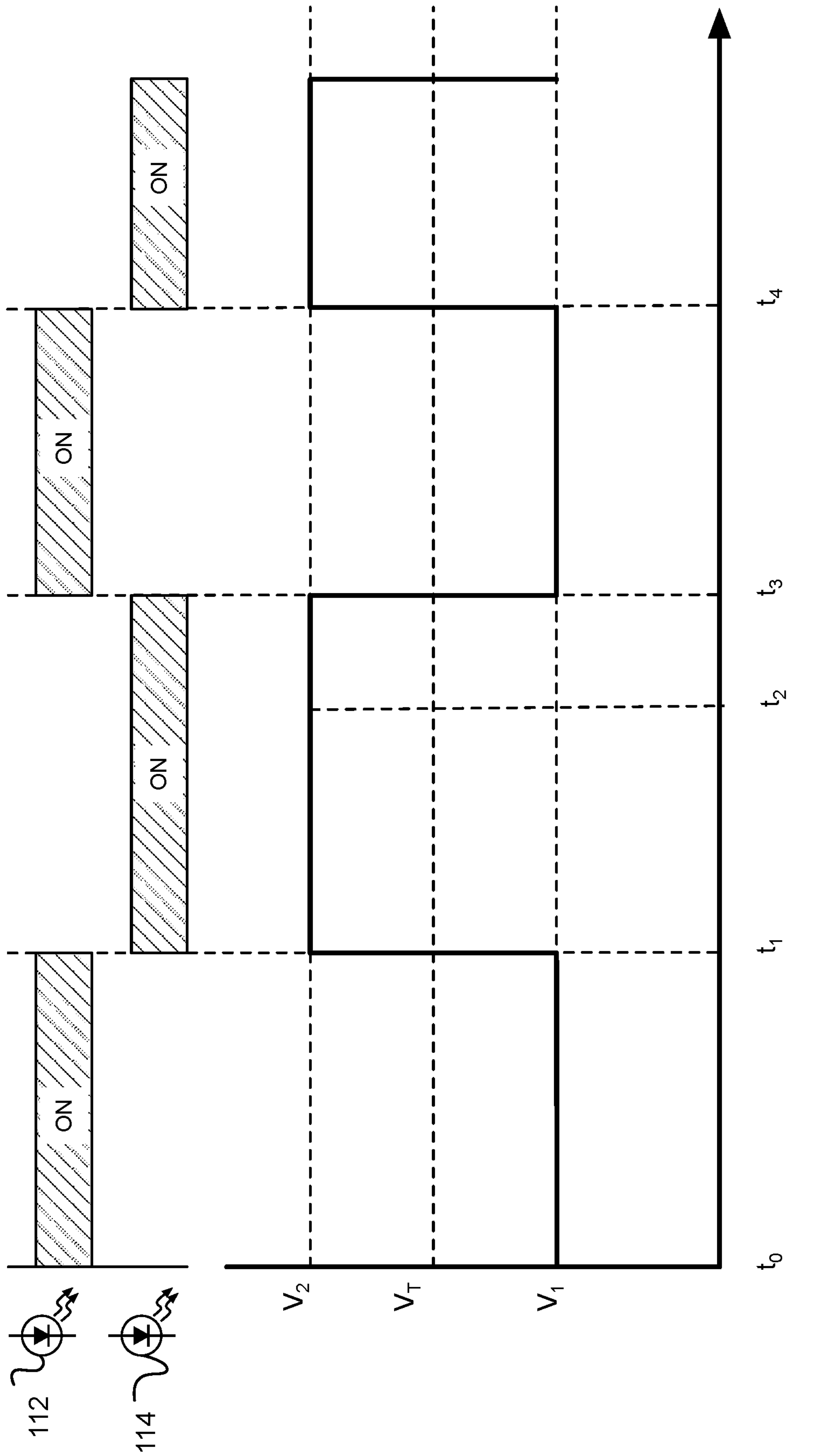
FIG. 5 shows a graph of voltage across a circuit of a power tool according to an example.

Turning to FIGS. 2, 3, 4, and 5 control of the LED indicators 112, 114, 116 will now be discussed in more detail. FIG. 2 shows a schematic side view of electrical components of the power tool 100. FIGS. 3 and 4 show electrical circuit diagrams of the power tool 100. FIG. 5 shows a graph of voltage across a circuit of the power tool 100.

FIG. 2 shows a motor control circuit 202 comprising a motor control unit 204. The motor control unit 204 is configured to control the speed and actuation of the electric motor 200. The motor control unit 204 detects one or more user inputs e.g. from the trigger button 108. Control of the electric motor 200 with a motor control unit 204 is known and will not be discussed in detail. The motor control unit 204 comprises a plurality of input and output pins for controlling different components on the power tool 100.

A problem with existing motor control units 204 is that there are a limited number of output pins for controlling and actuating components such as the LED indicators 112, 114, 116. This means in some circumstances the power tool 100 may be more complex and require an experienced user. In order for the user to correctly use the power tool 100, the user requires more information about the condition of the power tool 100 during use. Therefore more indicators such as LED indicators 112, 114, 116 are required to indicate different conditions of the power tool 100.

In some circumstances, in order to provide indications of power tool 100 conditions, additional LED indicators 112, 114, 116 are required. This may mean that the motor control unit 204 has fewer output pins than the number of LED indicators 112, 114, 116. Accordingly, the motor control unit 204 cannot directly control each LED indicator 112, 114, 116. It may not be desirable to replace the motor control unit 204 because this requires extensive redesign and product testing.

Instead, the motor control circuit 202 is connected to a power tool condition indication circuit 206 electrically connected to a single output of the motor control unit 204 of the motor control circuit 202. The power tool condition indication circuit 206 is configured to control the actuation of the first LED indicator 112 and the second LED indicator 114. In this way, the power tool condition indication circuit 206 is retrofittable to the existing motor control unit 204 in order to use the motor control unit 204 with more LED indicators 112, 114.

Whilst the examples described hereinafter discuss the motor control circuit 202 being connected to a power tool condition indication circuit 206, any control circuit in the power tool 100 can be connected to the power tool condition indication circuit 206. The control circuit is configured to control at least one operation of the power tool. For example, the control circuit may be a battery control circuit mounted in the battery pack 110. In this way, any control circuit in the power tool 100 can be connected to the power tool condition indication circuit 206 in order to indicate a condition of the power tool 100. Hereinafter, the examples will be discussed in reference to the motor control circuit 202, but any suitable control circuit can be used instead.

A third LED indicator 116 as shown in FIG. 2 is connected to the motor control unit 204. The motor control unit 204 is configured to send a control signal to the third LED indicator 116 directly via an output pin on the motor control unit 204. Whilst FIG. 2 only shows one third LED indicator 116 directly connected to an output pin of the motor control unit 204, there can be any number of third LED indicators 116 connected to separate output pins of the motor control unit 204. The number of third LED indicators 116 connected to separate output pins of the motor control unit 204 will depend on the configuration of the motor control unit 204.

The power tool condition indication circuit 206 will be discussed in more detail with respect to FIGS. 3, 4 and 5. FIG. 3 shows a circuit diagram for the power tool condition indication circuit 206. The power tool condition indication circuit 206 comprises an analogue circuit configured to control a plurality of LED indicators 112, 114 when receiving a signal from a single output pin from the motor control unit 204. Advantageously the power tool condition indication circuit 206 is an analogue circuit and is easily retrofittable to existing power tools 100.

As shown in FIG. 3, the plurality of indicators is the first LED indicator 112 and the second LED indicator 114. The power tool condition indication circuit 206 receives a voltage signal 302. In some examples, the motor control unit 204 is not configured to provide enough power to drive the power tool condition indication circuit 206. In some examples, the voltage signal 302 is a pulse width modulation (PWM) of the battery 110 voltage controlled by the output signal of the motor control unit 204. The motor control unit 204 is configured to control the voltage signal 302 and drive the power tool condition indication circuit 206 via an indicator amplification circuit 400 (best shown in FIG. 4).

The indicator amplification circuit 400 will now be discussed. Since the motor control unit 204 does not drive the power tool condition indication circuit 206 itself, the motor control unit 204 controls the indicator amplification circuit 400 to generate the PWM voltage signal 302 from the battery 110. The indicator amplification circuit 400 comprises a MOSFET 402 as shown in FIG. 4. Amplification circuits 400 as shown in FIG. 4 are known and will not be discussed in any further detail.

Turning back to FIG. 3, the power tool condition indication circuit 206 will be discussed in more detail. The power tool condition indication circuit 206 comprises a Zener diode 300. The Zener diode 300 is configured to selectively allow a current to pass through in dependence of a threshold voltage $V_T$. The threshold voltage $V_T$ is shown in FIG. 5 which shows a voltage graph of the circuit voltage V at the Zener diode 300 at different times. FIG. 5 as schematically shows the operational status of the first and second LED indicators 112, 114. The circuit voltage V at the Zener diode 300 is dependent on the voltage signal 302 controlled by the motor control unit 204.

When the circuit voltage V at the Zener diode 300 is at a first voltage $V_1$ which is below the threshold voltage $V_T$, the Zener diode 300 does not allow current to flow through the Zener diode 300. For example, as shown in FIG. 5, at time $t=t_0$ the circuit voltage V at the Zener diode 300 is at the first voltage $V_1$ and the current does not flow through the Zener diode 300.

When the circuit voltage V at the Zener diode 300 is at a second voltage $V_2$ which is above the threshold voltage $V_T$, the Zener diode 300 allows current to flow through the Zener diode 300. For example, as shown in FIG. 5, at time $t=t_2$ the circuit voltage V at the Zener diode 300 is at the second voltage $V_2$ and the current flows through the Zener diode 300.

The voltage signal 302 is connected to a first resistor 304. The first resistor 304 is connected ground 322 via a first capacitor 320. The first resistor 304 and the first capacitor 320 are configured to function as a low pass filter 324. The low pass filter 324 is configured to covert the PWM voltage signal 302 to a DC circuit voltage V. When the duty cycle of the PWM voltage signal 302 rises, the DC circuit voltage V after the low pass filter 324 also rises. When the DC circuit voltage V exceeds the threshold voltage $V_T$ of the Zener diode 300, the Zener diode 300 becomes conductive. The low pass filter 324 allows the Zener diode 300 to remain continuously conductive above the threshold voltage $V_T$ during the duty cycle of the PWM voltage signal 302.

The actuation of the first LED indicator 112 is controlled by a first transistor 312. The emitter of the first transistor 312 is configured to generate a first indication signal. In some examples the emitter of the first transistor 312 is connected to first LED indicator 112. In this way, the first indication signal is configured to actuate the first LED indicator 112. The collector of the first transistor 312 is connected to a second resistor 306. The base of the first transistor 312 is connected to the collector of the second transistor 314. The base of the first transistor 312 is also connected to a third resistor 308 and a fourth resistor 310. The fourth resistor 310 is also connected to the ground 322.

The actuation of the second LED indicator 114 is controlled by the Zener diode 300 and a second transistor 314. The Zener diode 300 is configured to output a second indication signal. In some examples, the second LED indicator 114 is connected to the Zener diode 300. In this way, the second indication signal is configured to actuate the second LED indicator 114.

The second LED indicator 114 is also connected to a fifth resistor 316 and a sixth resistor 318. The fifth resistor 316 is connected to the base of the second transistor 314. The fifth resistor 316 is configured to limit the base current to the second transistor 314.

The emitter of the second transistor 314 is connected to the ground 322. As mentioned above, the collector of the second transistor 314 is connected to the base of the first transistor 312. The collector of the second transistor 314 is also connected to the third resistor 308 and the fourth resistor 310. When the Zener diode 300 becomes conductive a base current through the second transistor 314 will flow as a result. This base current will switch the second transistor 314 on and by this the second transistor 314 becomes conductive from collector to emitter. As a result, the voltage at the collector of the second transistor 314 drops down ground 322. This will also affect the voltage at the base of the first transistor 312 as this is connected to the collector of the first transistor 312. This switches the first transistor 312 off (and as a result the first LED 112 as well). This describes the state when the Zener diode 300 becomes conductive and so the second LED 114 is on and the first LED 112 is off.

When the Zener diode 300 is not conductive, the first LED 112 is on and the second LED 114 is off.

The third resistor 308 and the fourth resistor 310 are configured to generate a voltage at the base of the first transistor 314 which leads to a base current in the first transistor 312 and which switches the first transistor 312 on. As a result, the first LED 112 is on. The third resistor 308 is also configured to limit the base current into the first transistor 312.

The function of the power tool condition indication circuit 206 will now be discussed. At $t=t_0$ the circuit voltage V at the Zener diode 300 is $V_1$ which is below the threshold voltage $V_T$ of the Zener diode 300. At this point, the Zener diode 300 is not conductive. This means that a current does not flow through the Zener diode 300 and the second LED indicator 114. Accordingly, the second indication signal is not transmitted to the second LED indicator 114 and the second LED indicator 114 is not actuated.

Since the Zener diode 300 is not conductive, there is no current flowing through the base of the second transistor 314. This means that the second transistor 314 is also not actuated.

This means that the current flows through the third resistor 308 and a current flows through the base of the first transistor 312. Since a current flows through the base of the first transistor 312, the first transistor 312 is actuated. The current flows through the first transistor 312 and actuates the first LED indicator 112. Accordingly, the first indication signal actuates the first LED indicator 112. FIG. 5 shows that the first LED indicator 112 is on between $t=t_0$ and $t=t_1$.

At $t=t_1$ the motor control unit 204 changes the voltage signal 302 and the circuit voltage V at the Zener diode 300 increases to the second voltage $V_2$. As mentioned above, the second voltage $V_2$ is above the threshold voltage $V_T$ and the Zener diode 300 becomes conductive.

When the Zener diode 300 becomes conductive, the current flows through the second LED indicator 114 and the base of the second transistor 314. The second transistor 314 is actuated. This means that the second indication signal actuates the second LED indicator 114. This means that the current flows through the third resistor 308 and the second transistor 314. At the same time the is no longer a current flowing through the base of the first transistor 312 and the first transistor 312 is no longer actuated. This prevents a current flowing through the emitter and collector of the first transistor 312 and the first LED indicator 112. Accordingly, the first indication signal is not transmitted to the first LED indicator 112 and the first LED indicator 112 is not actuated.

Between $t=t_1$ and $t=t_2$ the first LED indicator 112 is off and the second LED indicator 114 is on as shown in FIG. 5. When the motor control unit 204 changes the voltage signal e.g. at $t=t_3$ the circuit voltage V at the Zener diode 300 is below the threshold voltage $V_T$. Then the first LED indicator 112 is on and the second LED indicator 114 is off.

By using the power tool condition indication circuit 206, the motor control unit 204 is able to control two LED indicators 112, 114 using a single signal e.g. a single output pin of the motor control unit 204.

As mentioned above, the first and second LED indicators 112, 114 can be additionally or alternatively replaced with a buzzer or speaker, or haptic generator to respectively generate an audible or vibration signal for the user.

In some examples, the first and second indication signals are configured to be received by a remote device additionally or alternatively to respectively actuating the first and second LED indicators 112, 114. For example, the remote device can be a smartphone or other remote device configured to receive the first and second indication signals. The smartphone can then issue a visual alert on a display to indicate a first condition of the power tool 100 or a second condition of the power tool 100 in dependence of the received first indication signal or the second indication signal.

The examples as discussed above use the power tool condition indication circuit 206 on a single output pin of the motor control unit 204. In some examples, a plurality power tool condition indication circuits 206 are connected to the different pins on the motor control unit 204. For example a first power tool condition indication circuit 206 is connected to a first output pin of the motor control unit 204 and a second power tool condition indication circuit 206 is connected to a second output pin of the motor control unit 204. In further examples, any number of output pins of the motor control unit 204 can be connected to a power tool condition indication circuit 206. Accordingly, the motor control unit 204 can actuate additional LED indicators by retrofitting the power tool condition indication circuit 206 as needed to output pins of the motor control unit 204.

In some other examples, the power tool condition indication circuit 206 comprises a plurality of Zener diodes 300 with different threshold voltages. The power tool condition indication circuit 206 comprises n Zener diodes 300 and n+1 first and second LED indicators 112, 114 and n+1 transistors. The power tool condition indication circuit 206 functions the same as described with respect to the previous examples. This means that the different Zener diodes 300 differential different circuit voltages V and can actuate the respective first and second LED indicators 112, 114 accordingly.

In some alternative examples, the power tool condition indication circuit 206 is electrically connected to another control circuit instead of the motor control circuit 202. For example, the power tool condition indication circuit 206 is connect to a battery control circuit (not shown). The battery control circuit and the power tool condition indication circuit 206 are connected together and function the same as discussed in reference to the examples shown in the Figures. In this way, the power tool condition indication circuit 206 can be mounted in a power tool accessory such as a battery pack 110.

In another example, two or more examples are combined. Features of one example can be combined with features of other examples.

Examples of the present disclosure have been discussed with particular reference to the examples illustrated. However it will be appreciated that variations and modifications may be made to the examples described within the scope of the disclosure.

The invention claimed is:

1. A power tool comprising:

a housing;

an electrical power source;

a control circuit electrically connected to the electrical power source and configured to control at least one operation of the power tool; and a power tool condition indication circuit electrically connected to the control circuit comprising a Zener diode configured to be conductive at a threshold voltage;

wherein the power tool condition indication circuit is configured to generate a first indication signal when a voltage controlled by the control circuit is below the threshold voltage and generate a second indication signal when the voltage controlled by the control circuit exceeds the threshold voltage; and wherein the power tool condition indication circuit is configured to selectively permit current flow through one of a plurality of transistors based on whether the voltage is above or below the threshold voltage.

2. The power tool according to claim 1, wherein the first indication signal is configured to actuate a first light emitting diode.

3. The power tool according to claim 2, wherein the second indication signal is configured to actuate a second light emitting diode.

4. The power tool according to claim 1, wherein the power tool condition indication circuit is configured to permit current to flow through a first transistor when the voltage controlled by the control circuit is below the threshold voltage.

5. The power tool according to claim 4, wherein the power tool condition indication circuit is configured to permit current to flow through a second transistor when the voltage controlled by the control circuit exceeds the threshold voltage.

6. The power tool according to claim 1, wherein the second indication signal is configured to indicate a second condition of the power tool.

7. The power tool according to claim 6 wherein the second condition of the power tool is an overpressing condition of the power tool.

8. The power tool according to claim 7, wherein the first indication signal is configured to indicate a first condition of the power tool.

9. The power tool according to claim 8, wherein the first condition is a rotation condition of the power tool.

10. The power tool according to claim 8, wherein the second condition and the first condition of the power tool correspond to different parameters of the power tool.

11. The power tool according to claim 8, wherein the first indication signal is configured to actuate a first buzzer or speaker.

12. The power tool according to claim 10, wherein the first indication signal and the second indication signal are transmitted to a remote device.

13. The power tool according to claim 1, wherein an output of the control circuit is electrically connected to a first MOSFET coupled to the electrical power source and the power tool condition indication circuit and the first MOSFET is configured to generate a pulse width modulation from the electrical power source in dependence of the output of the control circuit.

14. The power tool according to claim 1, wherein the electrical power source is a battery mounted to the housing.

15. The power tool according to claim 1, wherein the power tool comprises a motor mounted to the housing and electrically connected to the electrical power source and the control circuit is a motor control circuit configured to control the motor.

16. The power tool according to claim 1, wherein the control circuit is configured to generate a pulse width modulation signal that controls the voltage applied to the power tool condition indication circuit.

17. A power tool comprising:

a housing;

an electrical power source;

a control circuit electrically connected to the electrical power source and configured to control at least one operation of the power tool; and a power tool condition indication circuit electrically connected to the control circuit;

wherein the power tool condition indication circuit is configured generate a first indication signal when a voltage controlled by the control circuit exceeds a threshold voltage and generate a second indication signal when a voltage controlled by the control circuit is below the threshold voltage;

wherein the first indication signal is configured to indicate a first condition of the power tool;

wherein the second indication signal is configured to indicate a second condition of the power tool;

wherein the first condition is a rotation condition of the power tool; and wherein the second condition is an overpressing condition of the power tool.

18. The power tool of claim 17, wherein the power tool condition indication circuit is configured to permit current to flow through a first transistor when the voltage controlled by the control circuit is below the threshold voltage; and wherein the power tool condition indication circuit is configured to permit the current to flow through a second transistor when the voltage controlled by the control circuit exceeds the threshold voltage.

19. The power tool of claim 18, wherein an output of the control circuit is electrically connected to a first MOSFET coupled to the electrical power source and the power tool condition indication circuit and the first MOSFET is configured to generate a pulse width modulation from the electrical power source in dependence of the output of the control circuit.

20. A power tool comprising:

a housing;

an electrical power source;

a control circuit electrically connected to the electrical power source and configured to control at least one operation of the power tool; and a power tool condition indication circuit electrically connected to the control circuit;

wherein the power tool condition indication circuit is configured generate a first indication signal when a voltage controlled by the control circuit is below a threshold voltage and generate a second indication signal when a voltage controlled by the control circuit exceeds the threshold voltage;

wherein the first indication signal is configured to indicate a first condition of the power tool;

wherein the second indication signal is configured to indicate a second condition of the power tool;

wherein the second condition and the first condition of the power tool correspond to different parameters of the power tool;

wherein the power tool condition indication circuit is configured to selectively permit current flow through one of a plurality of transistors based on whether the voltage is above or below the threshold voltage; and wherein the control circuit is configured to generate a pulse width modulation signal that controls the voltage applied to the power tool condition indication circuit.

* * * * *